(12) United States Patent
Kwon et al.

(10) Patent No.: US 12,372,593 B2
(45) Date of Patent: Jul. 29, 2025

(54) SPIN HALL MAGNETIC SENSOR AND METHOD OF MEASURING MAGNETORESISTANCE USING THE SAME

(71) Applicants: HYUNDAI MOTOR COMPANY, Seoul (KR); KIA CORPORATION, Seoul (KR); KOREA INSTITUTE OF SCIENCE AND TECHNOLOGY

(72) Inventors: Joon-Hyun Kwon, Hwaseong-si (KR); Hyun-Soo Kim, Suwon-si (KR); Sang-Hyeok Yang, Suwon-si (KR); Su-Jung Noh, Seoul (KR); Han-Saem Lee, Seoul (KR); Ji-Sung Lee, Hwaseong-si (KR); Byoung-Chul Min, Seoul (KR); Jong-Bum Choi, Seoul (KR); Dong-Soo Han, Seoul (KR)

(73) Assignees: HYUNDAI MOTOR COMPANY, Seoul (KR); KIA CORPORATION, Seoul (KR); KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 180 days.

(21) Appl. No.: 18/231,994

(22) Filed: Aug. 9, 2023

(65) Prior Publication Data
US 2024/0393413 A1    Nov. 28, 2024

(30) Foreign Application Priority Data
May 26, 2023 (KR) .................. 10-2023-0068641

(51) Int. Cl.
*G01R 33/07*    (2006.01)
*G01R 33/00*    (2006.01)
*G01R 33/09*    (2006.01)

(52) U.S. Cl.
CPC ....... *G01R 33/075* (2013.01); *G01R 33/0005* (2013.01); *G01R 33/093* (2013.01); *G01R 33/096* (2013.01)

(58) Field of Classification Search
CPC ............. G01R 33/075; G01R 33/0005; G01R 33/093; G01R 33/096; G01R 33/07; G01R 15/202; H01F 10/06; H01F 10/32
See application file for complete search history.

(56) References Cited

U.S. PATENT DOCUMENTS

| | | | |
|---|---|---|---|
| 2014/0226239 A1* | 8/2014 | Mihajlovic | G01R 33/07 360/112 |
| 2018/0137969 A1* | 5/2018 | Hamamura | H01F 27/36 |
| 2018/0358543 A1* | 12/2018 | Le | G01R 33/07 |
| 2020/0303634 A1* | 9/2020 | Inubushi | H01F 10/325 |
| 2022/0026506 A1* | 1/2022 | Kim | G01R 33/07 |

FOREIGN PATENT DOCUMENTS

KR    2020-0065678 A    6/2020

* cited by examiner

*Primary Examiner* — Alvaro E Fortich
(74) *Attorney, Agent, or Firm* — MCDONNELL BOEHNEN HULBERT & BERGHOFF LLP (57) ABSTRACT

A spin Hall magnetic sensor includes a plurality of magnetic thin film units including a magnetic layer stacked on a non-magnetic layer, and a plurality of non-magnetic substances disposed between the plurality of magnetic thin film units, The magnetic includes a Wheatstone bridge structure to observe a magnetic Hall resistance generated by a spin orbit torque (SOT).

9 Claims, 6 Drawing Sheets

SPIN HALL MAGNETIC SENSOR AND METHOD OF MEASURING MAGNETORESISTANCE USING THE SAME

CROSS REFERENCE TO RELATED APPLICATIONS

This application claims priority to Korean Patent Application No. 10-2023-0068641, filed on May 26, 2023, which is incorporated herein by reference in its entirety.

BACKGROUND

Field of the Disclosure

The present disclosure relates to a magnetic sensor using the spin Hall effect and a method of measuring magnetic resistance using the same.

Description of Related Art

In the case of a multilayer magnetic thin film structure composed of a non-magnetic layer/magnetic layer/non-magnetic layer, when a charge current is injected from the outside, a spin current is generated in the non-magnetic layer by the spin Hall effect, and the spin current is transmitted to an adjacent magnetic layer to generate a spin-orbit torque (SOT).

Figure 1:
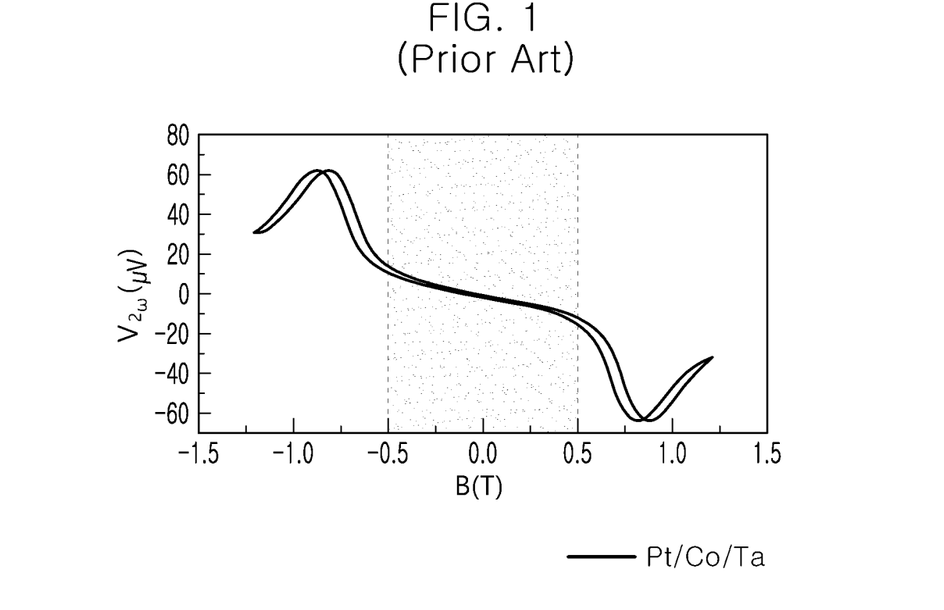
FIG. 1 is a view illustrating a result of observing a secondary harmonic signal on a Hall voltage generated after inputting an alternating current (AC) signal on a vertically magnetized multilayer magnetic thin film.

As an example, FIG. 1 is a result of observing a secondary harmonic signal on a Hall voltage generated after inputting an alternating current (AC) signal on a vertically magnetized multilayer magnetic thin film.

It can be seen that an output signal of the corresponding signal has linearity with respect to a magnetic field in a specific section.

Based on the relational expression between B (magnetic field)–$V_{out}$ (output signal) in a linear section, the multilayer magnetic thin film may be used as a sensor for detecting an external magnetic field.

Meanwhile, a Wheatstone bridge structure is already used in magnetic sensors because it may easily detect a change in a minute resistance and improve signal sensitivity.

In particular, when an angle α of a unit structure constituting the Wheatstone bridge structure varies, it is possible to measure a magnetic Hall resistance $R_{xy}$ as well as a magnetic resistance $R_{xx}$ in an x-y plane.

For example, output voltages according to planar Hall resistances generated in general magnetic thin films are given as follows:

$$V_{out} \sim I_0 N \left(\frac{l}{2tw}\rho_{PHE} \sin 2\phi\right) @ \alpha = 45°$$

Matters described above in the background art are intended to help understanding of the background of the disclosure and may include matters not related to the related art already known to those skilled in the art to which this technology pertains.

SUMMARY

The present disclosure has been made in efforts to solve the above problems and is directed to providing a magnetic sensor and a method of measuring the same, which is more improved by a Wheatstone bridge structure to observe a magnetic Hall resistance generated by a spin orbit torque (SOT).

A spin Hall magnetic sensor according to one aspect of the present disclosure includes a plurality of magnetic thin film units including a magnetic layer stacked on a non-magnetic layer, and a plurality of non-magnetic substances disposed between the plurality of magnetic thin film units, wherein the plurality of magnetic thin film units include a first magnetic thin film unit having a longitudinal direction having a constant angle with an input direction of a current, a second magnetic thin film unit having a longitudinal direction disposed to form a constant angle with the longitudinal direction of the first magnetic thin film unit, a third magnetic thin film unit having a longitudinal direction disposed parallel to the first magnetic thin film unit, and a fourth magnetic thin film unit having a longitudinal direction disposed parallel to the second magnetic thin film unit.

Here, when a current is injected to the magnetic thin film unit, a spin current may be generated in the non-magnetic layer, and a spin orbit torque (SOT) may be generated on the magnetic layer.

In addition, the plurality of non-magnetic substances may include a first non-magnetic substance connecting the first magnetic thin film unit with the second magnetic thin film unit, a second non-magnetic substance connecting the second magnetic thin film unit with the third magnetic thin film unit, a third non-magnetic substance connecting the third magnetic thin film unit with the fourth magnetic thin film unit, and a fourth non-magnetic substance connecting the fourth magnetic thin film unit with the first magnetic thin film unit.

In addition, the longitudinal direction of the first magnetic thin film unit may be formed at an angle of 45°±5° with an input direction of the current.

In addition, the plurality of non-magnetic substances may have a metal alloy structure in which the SOT is generated or a superlattice structure.

Meanwhile, each of the plurality of magnetic thin film units may have three or more units connected.

Furthermore, when the number of units of each of the plurality of magnetic thin film units is 2n+1 (n is a natural number), n units among the units may be non-magnetic substances.

Then, a method of measuring a magnetic resistance using the spin Hall magnetic sensor according to one aspect of the present disclosure includes applying a current to the spin Hall magnetic sensor, measuring an output voltage $V_{total}$ of the spin Hall magnetic sensor, and detecting a secondary harmonic signal voltage $V_{DC,2nd}$ from the output voltage.

In addition, the applying of the current to the spin Hall magnetic sensor may include applying an alternative current (AC) current.

According to the spin Hall magnetic sensor and the method of measuring the magnetic resistance using the same according to the present disclosure, by removing other components than the SOT and using only the magnetic resistance component generated by the SOT, it is possible to provide the magnetic sensor with the higher sensitivity than the conventional magnetic sensor.

DETAILED DESCRIPTION

For a full understanding of the present disclosure, operational advantages of the present disclosure, and objects to be achieved by practicing the present disclosure, reference should be made to the accompanying drawings, which illustrate preferred embodiments of the present disclosure, and contents described in the accompanying drawings.

In describing the preferred embodiments of the present disclosure, a description of known techniques or repetitive descriptions that may unnecessarily obscure the gist of the present disclosure will be reduced or omitted.

Figure 2:
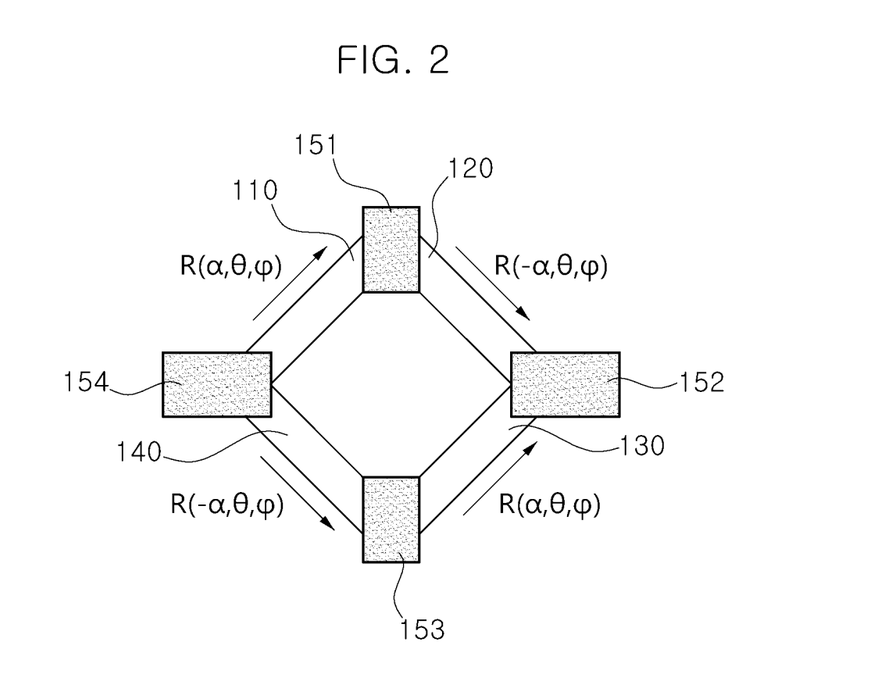
FIG. 2 is a view schematically illustrating a spin Hall magnetic sensor according to a first embodiment of the present disclosure.

FIG. 2 is a view schematically illustrating a spin Hall magnetic sensor according to a first embodiment of the present disclosure. Hereinafter, a spin Hall magnetic sensor according to the present disclosure will be described with reference to FIG. 2.

A spin Hall magnetic sensor 100 according to the present disclosure functions as a magnetic sensor with high sensitivity, which uses the spin Hall effect by a multilayer magnetic thin film structure and is formed in a Wheatstone bridge structure to measure a magnetic Hall resistance through an angle configuration of a unit and uses only a magnetic resistance component generated by a spin orbit torque (SOT).

To this end, the spin Hall magnetic sensor 100 is configured to include a plurality of magnetic thin film units 110, 120, 130, and 140 and a plurality of non-magnetic substances 151, 152, 153, and 154.

The plurality of magnetic thin film units are composed of a first magnetic thin film unit 110 having a longitudinal direction forming a constant angle with a direction of an input current, a second magnetic thin film unit 120 having a longitudinal direction disposed to form a constant angle with the longitudinal direction of the first magnetic thin film unit 110, a third magnetic thin film unit 130 having a longitudinal direction disposed to form a constant angle with the longitudinal direction of the second magnetic thin film unit 120 and disposed parallel to the first magnetic thin film unit 110, and a fourth magnetic thin film unit 140 having a longitudinal direction disposed to form a constant angle with the longitudinal direction of the third magnetic thin film unit 130 and disposed parallel to the second magnetic thin film unit 120.

In addition, the plurality of non-magnetic substances are composed of a first non-magnetic substance 151 connecting the first magnetic thin film unit 110 with the second magnetic thin film unit 120, a second non-magnetic substance 152 connecting the second magnetic thin film unit 120 and the third magnetic thin film unit 130, a third non-magnetic substance 153 connecting the third magnetic thin film unit 130 with the fourth magnetic thin film unit 140, and a fourth non-magnetic substance 154 connecting the fourth magnetic thin film unit 140 with the first magnetic thin film unit 110.

That is, the non-magnetic substance is disposed at a node between the magnetic thin film units.

In addition, the magnetic thin film unit has a multilayer magnetic thin film structure in which a non-magnetic layer/magnetic layer/non-magnetic layer are sequentially stacked, and when a charge current is injected from the outside, a spin current is generated in the non-magnetic layer by the spin Hall effect, and the spin current is transmitted to an adjacent magnetic layer to generate the SOT.

The magnetic thin film unit having the three-layer structure may have, for example, a Pt/Co/Ta structure.

Figure 3:
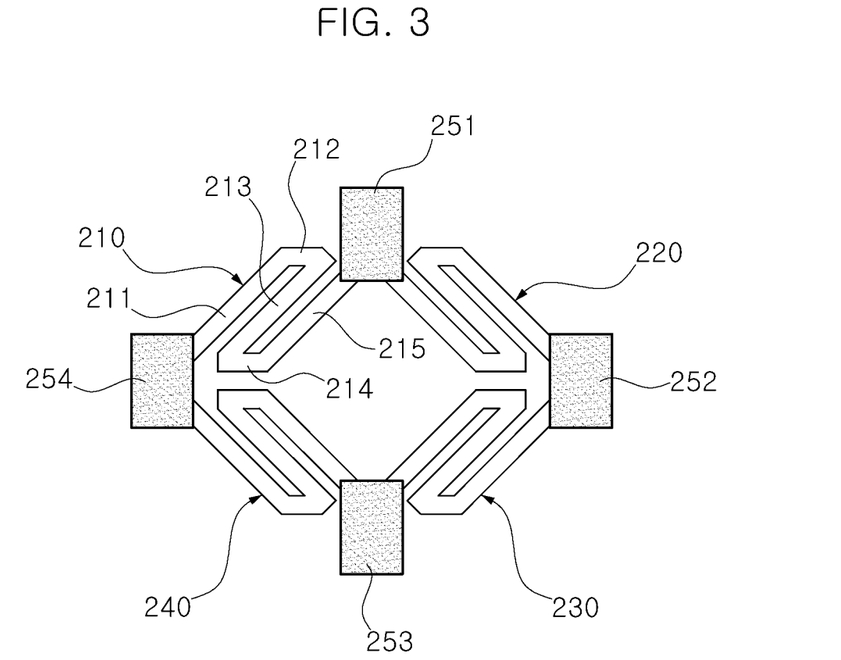
FIG. 3 is a view schematically illustrating a spin Hall magnetic sensor according to a second embodiment of the present disclosure.
Figure 4:
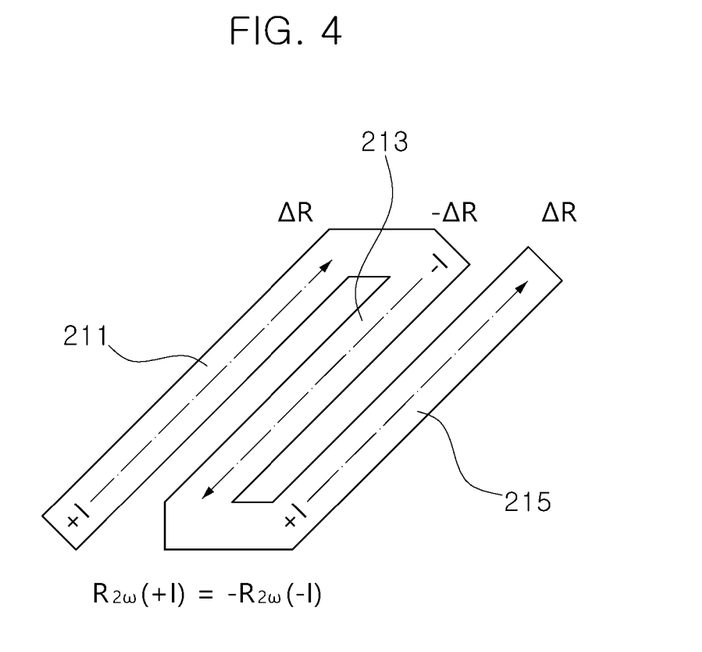
FIG. 4 is a view schematically illustrating one unit of the spin Hall magnetic sensor according to the second embodiment.
Figure 5:
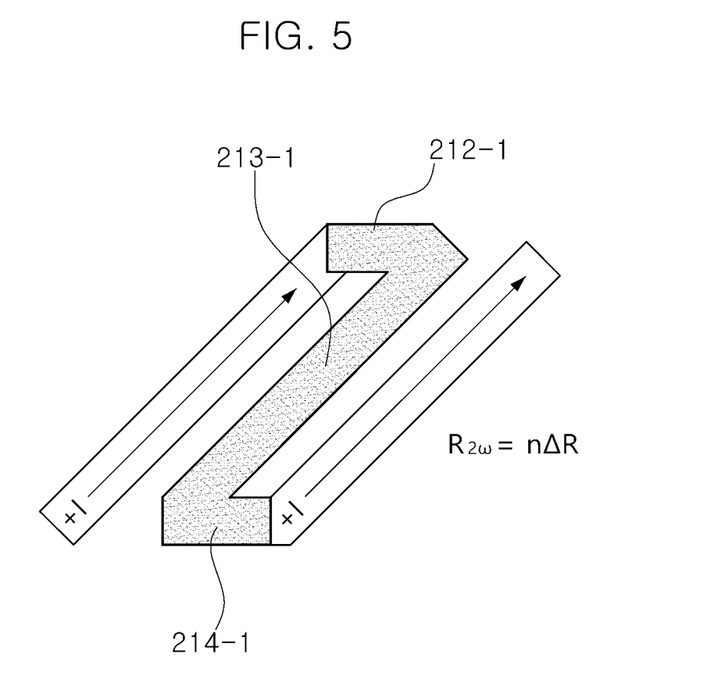
FIG. 5 is a view illustrating an application example of one unit of FIG. 4.

Then, FIG. 3 is a view schematically illustrating a spin Hall magnetic sensor according to a second embodiment of the present disclosure. In addition, FIG. 4 is a view schematically illustrating one unit of the spin Hall magnetic sensor according to the second embodiment, and FIG. 5 is a view illustrating an application example of one unit of FIG. 4.

The spin Hall magnetic sensor according to the second embodiment is configured to include a plurality of magnetic thin film units 210, 220, 230, and 240 and a plurality of non-magnetic substances 251, 252, 253, and 254.

The plurality of magnetic thin film units are composed of a first magnetic thin film unit 210, a second magnetic thin film unit 220 having a longitudinal direction disposed to form a constant angle with the longitudinal direction of the first magnetic thin film unit 210, a third magnetic thin film unit 230 having a longitudinal direction disposed to form a constant angle with the longitudinal direction of the second magnetic thin film unit 220 and disposed parallel to the first magnetic thin film unit 210, and a fourth magnetic thin film unit 240 having a longitudinal direction disposed to form a constant angle with the longitudinal direction of the third magnetic thin film unit 230 and disposed parallel to the second magnetic thin film unit 220.

In addition, the plurality of non-magnetic substances are composed of a first non-magnetic substance 251 connecting the first magnetic thin film unit 210 with the second magnetic thin film unit 220, a second non-magnetic substance 252 connecting the second magnetic thin film unit 220 and the third magnetic thin film unit 230, a third non-magnetic substance 253 connecting the third magnetic thin film unit 230 with the fourth magnetic thin film unit 240, and a fourth non-magnetic substance 254 connecting the fourth magnetic thin film unit 240 with the first magnetic thin film unit 210.

That is, the non-magnetic substance is disposed at a node between the magnetic thin film units.

Furthermore, the magnetic thin film unit of the spin Hall magnetic sensor according to the second embodiment is configured in a zig-zag shape and configured to improve an output signal by varying the number of times of repetitions N of the corresponding structure.

That is, the exemplary first magnetic thin film unit 210 may be composed of a first unit 211, a first connector 212, a second unit 213, a second connector 214, and a third unit 215, and the connectors and the units may be further repeated several times.

The first unit 211, the second unit 213, and the third unit 215 are formed parallel to the longitudinal direction of the first magnetic thin film unit 210, the first connector 212 is connected to the first unit 211 and one end of the second unit 213, and the second connector 214 is connected between the other end of the second unit 213 and the third unit 215.

In the present disclosure, in particular, unlike the structure in which the unit structure of the Wheatstone bridge generally used as the magnetic sensor is made of only a magnetic material, by inserting a non-magnetic material between the magnetic materials, a direction of a current flowing through the magnetic material may be constantly fixed at all times.

Hall resistance increase/decrease components due to the SOT depends on the direction of the current.

As illustrated in FIG. 4, when the first unit 211, the second unit 213, and the third unit 215 of the unit of the Wheatstone bridge structure are all made of a magnetic material, the Hall resistances (Hall voltages) generated by the SOT are all canceled.

On the other hand, as illustrated in FIG. 5, when a third unit 213-1 is formed of a non-magnetic substance and inserted into the middle of the Wheatstone bridge structure to fix the direction of the current flowing through the magnetic layer, the Hall resistance (output Hall voltage) due to the SOT increases in proportion to the number of structures N. As illustrated, a first connector 212-1 and a second connector 214-1 may also be non-magnetic substances. That is, three or more units may be formed, and when the number of units is 2n+1 (n is a natural number), n units among the units may be formed of non-magnetic substances.

In addition, as the non-magnetic material, a material usable as a general electrode such as Au or Cu may be used.

Figure 6:
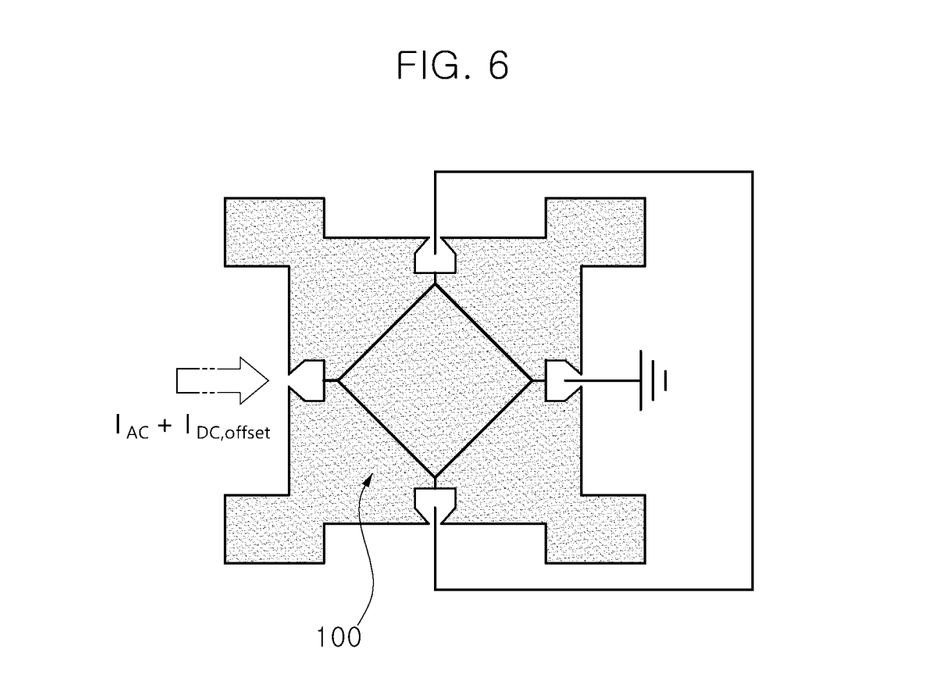
FIG. 6 is a view for describing a method of measuring a magnetic resistance using the spin Hall magnetic sensor according to the present disclosure.

Then, FIG. 6 is a view for describing a method of measuring a magnetic resistance using the spin Hall magnetic sensor according to the present disclosure.

The above-described method of measuring the magnetic resistance using the spin Hall magnetic sensor according to the present disclosure will be described with reference to FIG. 6.

In the case of the vertically magnetized material, an anomalous Hall resistance (AHE) should be considered, and an output voltage generated from the Wheatstone bridge structure is given as follows in consideration thereof.

$$V_{out} \sim 2N(\rho_{AHE}\cos\theta + \rho_{PHE}\sin^2\theta\sin\phi)\sin 2\alpha$$

(where θ: magnetized polar angle, φ: in-plane angle of magnetization, α: direction of current, and N: the number of segments)

In this case, each of $\rho_{AHE}$ and $\rho_{PHE}$ includes a magnetic resistance component due to the SOT.

The present disclosure is directed to developing a highly sensitive magnetic sensor technology using only the magnetic resistance component generated by the SOT rather than the conventional magnetic Hall resistance component.

Therefore, an AC current IAC is used as an input signal to remove other components than the SOT and improve sensor performance (noise characteristics).

When the AC current is input, a secondary harmonic signal generated by the SOT and a rectified voltage by the SOT are generated together on $\rho_{AHE}$ and $\rho_{PHE}$ in addition to components having the same frequency as a frequency of the input current.

This is simply expressed in an Equation as follows:

$$V_{total} = I_0 \sin(\omega t)R_0 + R_I \cos(\omega t)I_0 \sin(\omega t) + V_{DC,2nd} + V_{DC,offset}$$

In the above Equation, the second term and the third term at the right side respectively represent the secondary harmonic signal and the rectified voltage generated by the SOT. The fourth term corresponds to a DC offset voltage generated for structural reasons.

In the present disclosure, in the Wheatstone bridge structure including the above-described magnetic thin film unit, the AC current is applied through a node between the first magnetic thin film unit 110 and the fourth magnetic thin film unit 140, and a voltage $V_{total}$ between a node between the first magnetic thin film unit 110 and the second magnetic thin film unit 120 and a node between the third magnetic thin film unit 130 and the fourth magnetic thin film unit 140 is measured.

Figure 7:
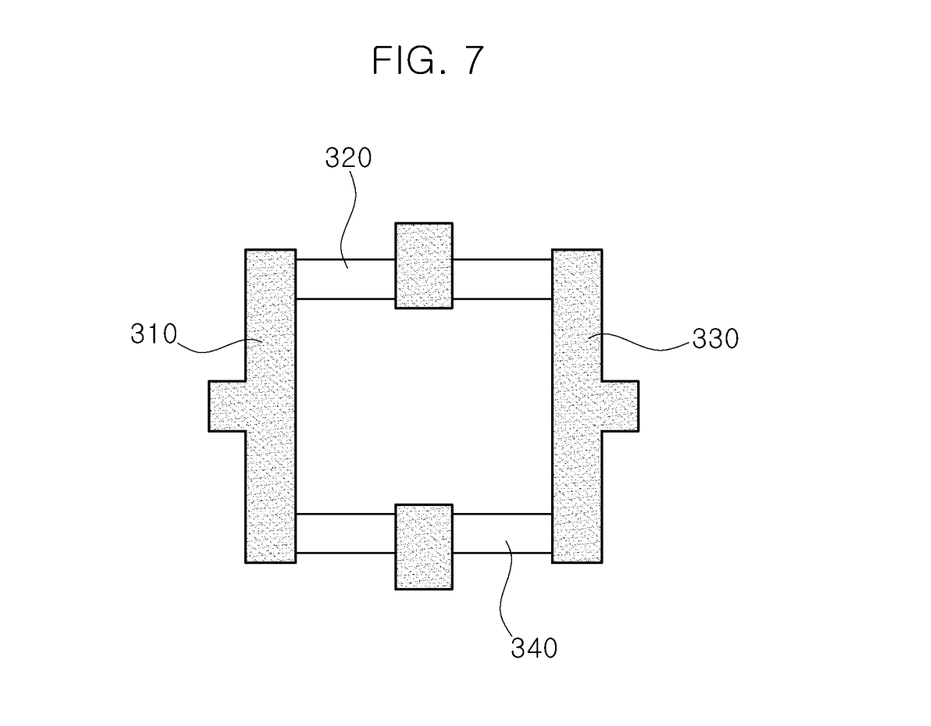
FIGS. 7 and 8 are views illustrating a sensor structure in which an anisotropic magnetic resistance may be measured.
Figure 8:
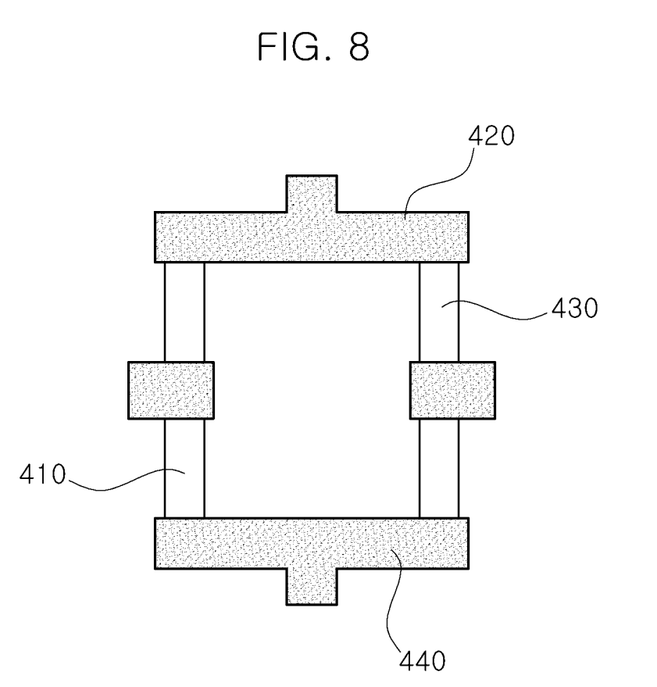

Then, FIGS. 7 and 8 are views illustrating a sensor structure in which an anisotropic magnetic resistance may be measured.

That is, FIGS. 7 and 8 illustrate a structure in which the AMR, which is the magnetic resistance effect that varies depending on a magnetic field and an angle of a current, may be measured when a bridge angle of the Wheatstone bridge is 0 or 90 degrees, and this structure may be used as an element for detecting another output signal.

FIG. 7 is a case in which the angle of the bridge is 0 degrees.

That is, the sensor structure has a structure in which longitudinal directions of the magnetic thin film units 320 and 340 are disposed in a direction parallel to the direction of the applied current, non-magnetic substances 310 and 330 are parallel to each other, and both ends of the magnetic thin film units 320 and 340 are disposed to be connected to each other.

In addition, FIG. 8 is a case in which the angle of the bridge is 90 degrees.

That is, the sensor structure is a structure in which longitudinal directions of the magnetic thin film units 410 and 430 are disposed in a direction perpendicular to the direction of the applied current, non-magnetic substances 420 and 440 are parallel to each other, and both ends of the magnetic thin film units 410 and 430 are disposed to be connected to each other.

In both cases, the magnetic resistive effect rather than the Hall effect may be observed.

The Hall resistance to be observed in the present disclosure has the largest output at an angle of 45±5°, and the sensor structure is a structure in which the magnetic resistive effect can be canceled or minimized.

Figure 9:
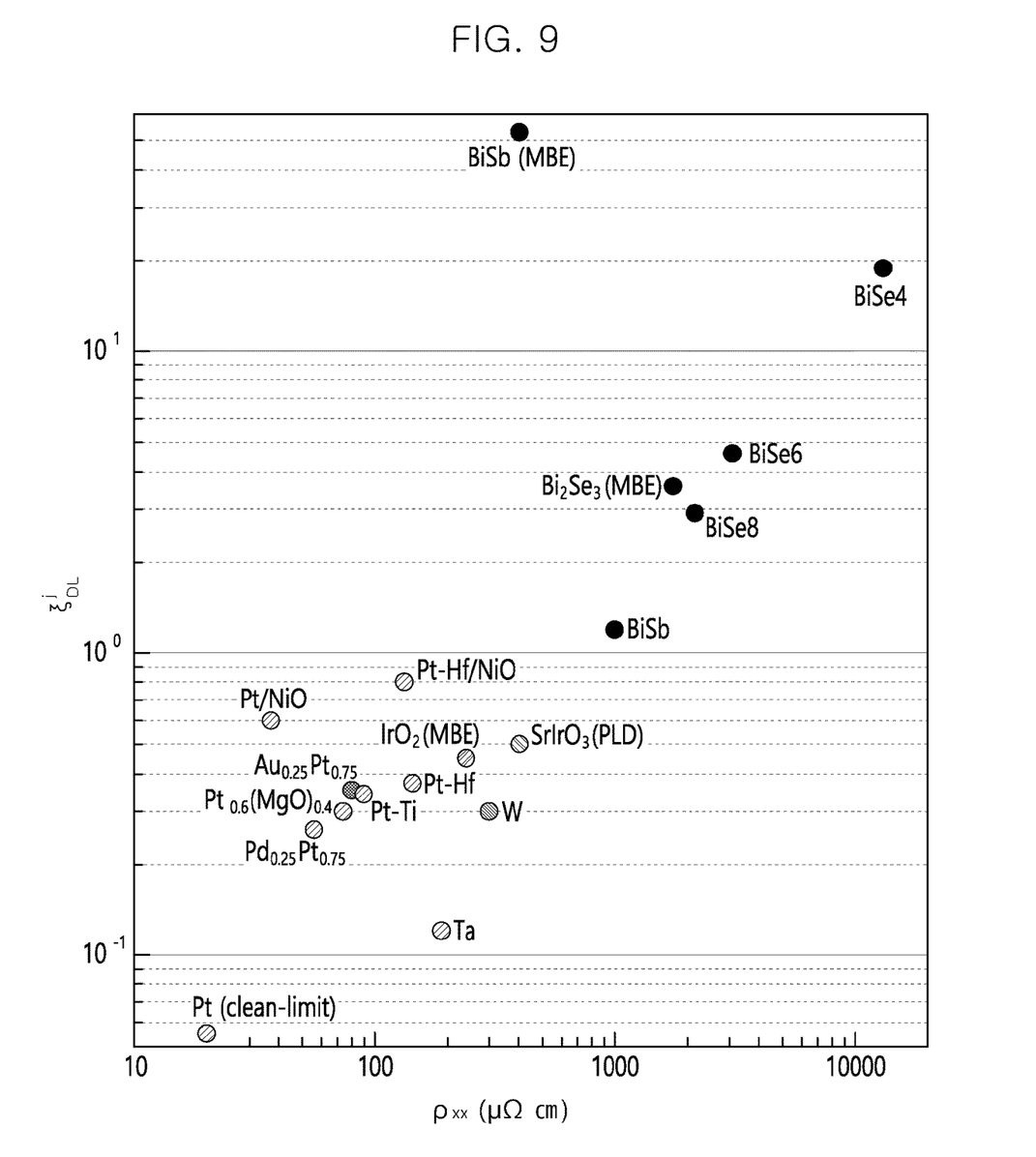
FIG. 9 is a view illustrating a non-magnetic material generating the spin Hall effect.

Meanwhile, FIG. 9 is a view illustrating a research result of representative materials generating a strong spin Hall effect.

In the drawing, since the material generating the high spin Hall effect in an upper right region has a high specific resistance, an input signal is expected to be very large when the material is used as an electronic element, thereby making it difficult to develop the material into a low-power element.

In the structure proposed by the present disclosure, the non-magnetic substance may have a metal alloy structure in which the SOT is generated or a superlattice structure.

Although the present disclosure has been described above with reference to the exemplary drawings, the present disclosure is not limited to the described embodiments, and it is apparent to those skilled in the art that various modifications and changes can be made without departing from the spirit and scope of the present disclosure. Therefore, these modified examples or changed examples should be included in the claims of the present disclosure, and the scope of the present disclosure should be construed based on the appended claims.

The invention claimed is:

1. A spin Hall magnetic sensor comprising:
   a plurality of magnetic thin film units including a magnetic layer stacked on a non-magnetic layer; and
   a plurality of non-magnetic substances disposed between the plurality of magnetic thin film units;
   wherein the plurality of magnetic thin film units include:
   a first magnetic thin film unit having a longitudinal direction having a constant angle with an input direction of a current;
   a second magnetic thin film unit having a longitudinal direction disposed to form a constant angle with the longitudinal direction of the first magnetic thin film unit;
   a third magnetic thin film unit having a longitudinal direction disposed parallel to the first magnetic thin film unit; and
   a fourth magnetic thin film unit having a longitudinal direction disposed parallel to the second magnetic thin film unit.

2. The spin Hall magnetic sensor of claim 1, wherein when the current is injected to the magnetic thin film unit, a spin current is generated in the non-magnetic layer, and a spin orbit torque (SOT) is generated on the magnetic layer.

3. The spin Hall magnetic sensor of claim 2, wherein the plurality of non-magnetic substances include:
   a first non-magnetic substance connecting the first magnetic thin film unit with the second magnetic thin film unit;
   a second non-magnetic substance connecting the second magnetic thin film unit with the third magnetic thin film unit;
   a third non-magnetic substance connecting the third magnetic thin film unit with the fourth magnetic thin film unit; and
   a fourth non-magnetic substance connecting the fourth magnetic thin film unit with the first magnetic thin film unit.

4. The spin Hall magnetic sensor of claim 3, wherein the longitudinal direction of the first magnetic thin film unit is formed at an angle of 45°±5° with an input direction of the current.

5. The spin Hall magnetic sensor of claim 3, wherein the plurality of non-magnetic substances have a metal alloy structure in which the SOT is generated or a superlattice structure.

6. The spin Hall magnetic sensor of claim 3, wherein each of the plurality of magnetic thin film units has three or more units connected to each other.

7. The spin Hall magnetic sensor of claim 6, wherein when the number of units of each of the plurality of magnetic thin film units is 2n+1, where n is a natural number, n units among the units are non-magnetic substances.

8. A method of measuring a magnetic resistance using the spin Hall magnetic sensor of claim 3, comprising:
   applying the current to the spin Hall magnetic sensor;
   measuring an output voltage $V_{total}$ of the spin Hall magnetic sensor; and
   detecting a secondary harmonic signal voltage $V_{DC,2nd}$ from the output voltage.

9. The method of claim 8, wherein the applying of the current to the spin Hall magnetic sensor includes applying an alternative current (AC) current.

* * * * *